(12) United States Patent
Franson et al.

(10) Patent No.: US 11,049,824 B2
(45) Date of Patent: Jun. 29, 2021

(54) ANTENNA APPARATUS WITH INTEGRATED ANTENNA ARRAY AND LOW LOSS MULTI-LAYER INTERPOSER

(71) Applicant: VIASAT, INC., Carlsbad, CA (US)

(72) Inventors: Steven J. Franson, Scottsdale, AZ (US); Joseph J. Luna, Gilbert, AZ (US)

(73) Assignee: VIASAT, INC., Carlsbad, CA (US)

( * ) Notice: Subject to any disclaimer, the term of this patent is extended or adjusted under 35 U.S.C. 154(b) by 0 days.

(21) Appl. No.: 16/655,523

(22) Filed: Oct. 17, 2019

(65) Prior Publication Data
US 2021/0118828 A1 Apr. 22, 2021

(51) Int. Cl.
| | | |
|---|---|---|
| *H01L 23/544* | (2006.01) | |
| *H01L 23/538* | (2006.01) | |
| *G03F 7/20* | (2006.01) | |
| *H01L 23/66* | (2006.01) | |
| *H01Q 1/22* | (2006.01) | |
| *H01Q 21/00* | (2006.01) | |
| *H01Q 21/06* | (2006.01) | |
| *H01L 23/498* | (2006.01) | |

(52) U.S. Cl.
CPC ........ *H01L 23/66* (2013.01); *H01L 23/49822* (2013.01); *H01Q 1/2283* (2013.01); *H01Q 21/0087* (2013.01); *H01Q 21/065* (2013.01); *H01L 2223/6616* (2013.01); *H01L 2223/6633* (2013.01); *H01L 2223/6677* (2013.01)

(58) Field of Classification Search
CPC .............. H01L 23/66; H01L 23/49822; H01L 2223/6616; H01L 2223/6636; H01L 2223/6677; H01Q 21/2283; H01Q 21/0087; H01Q 21/065
USPC ........................................................ 257/728
See application file for complete search history.

(56) References Cited

U.S. PATENT DOCUMENTS

| | | | |
|---|---|---|---|
| 2008/0079652 A1 | 4/2008 | Mohamadi | |
| 2013/0027274 A1 | 1/2013 | Carpentier et al. | |
| 2016/0352023 A1 | 12/2016 | Dang et al. | |
| 2018/0175476 A1* | 6/2018 | Teshiba | ............... H01L 25/18 |

OTHER PUBLICATIONS

International Search Report dated Mar. 19, 2021 in corresponding PCT Application No. PCT/US2020/0552911 (16 pages).

* cited by examiner

*Primary Examiner* — Tong-Ho Kim
(74) *Attorney, Agent, or Firm* — F. Chau & Associates, LLC

(57) ABSTRACT

Disclosed is an antenna apparatus including a radiating layer with a plurality of antenna elements forming an antenna array; a semiconductor wafer including multiple tiles each having beamforming circuits; and a multi-layer interposer. The multi-layer interposer may include: a lower dielectric layer adjacent to the substrate; an upper dielectric layer adjacent to the radiating layer; a metal layer between the lower and upper layers and including a plurality of conductive traces; a plurality of first vias extending through both the upper and lower layers and electrically coupling the beamforming circuits to the plurality of antenna elements; and a plurality of second vias extending between the beamforming circuits and the conductive traces to interconnect the tiles.

25 Claims, 10 Drawing Sheets

US 11,049,824 B2

ANTENNA APPARATUS WITH INTEGRATED ANTENNA ARRAY AND LOW LOSS MULTI-LAYER INTERPOSER

TECHNICAL FIELD

This disclosure relates generally to antennas and more particularly to compact configurations of antenna arrays integrated with beam forming circuitry.

DISCUSSION OF RELATED ART

Antenna arrays are currently deployed in a variety of applications at microwave and millimeter wave frequencies, including aircraft, satellites, vehicles, and base stations for general land-based communications. Such antenna arrays typically include patch radiating elements driven with phase shifting beamforming circuitry to generate a phased array for beam steering. In many cases it is desirable for an entire antenna system, including the antenna array and beamforming circuitry, to occupy minimal space with a low profile while still meeting requisite performance metrics. At high mm wave frequencies in particular, challenges exist to limit undesirable reactance and loss as wavelengths and dimensions/spacings of components are extremely small.

SUMMARY

In an aspect of the presently disclosed technology, an antenna apparatus includes a radiating layer including a plurality of antenna elements forming an antenna array; a semiconductor wafer including multiple tiles each having beamforming circuits; and a multi-layer interposer. The multi-layer interposer may include; a lower dielectric layer adjacent to the wafer; an upper dielectric layer adjacent to the radiating layer; a metal layer between the lower and upper dielectric layers and including a plurality of conductive traces; a plurality of first vias extending through both the upper and lower dielectric layers and electrically coupling the beamforming circuits to the plurality of antenna elements; and a plurality of second vias extending between the beamforming circuits and the conductive traces to interconnect the tiles.

In another aspect, an antenna apparatus includes a radiating layer with a plurality of antenna elements forming an antenna array; a semiconductor wafer including a plurality of RF beamforming circuits each having transistor regions internally formed within the semiconductor wafer, each beamforming circuit having at least one phase shifter, and a transmit path amplifier and/or a receive path amplifier; and a multi-layer interposer. The multi-layer interposer includes: a lower dielectric layer adjacent to the substrate; an upper dielectric layer adjacent to the radiating layer; a metal layer between the lower and upper layers and including a plurality of conductive traces that form a combiner/divider network that combines and/or divides signals between the plurality of RF beamforming circuits and an input/output connection point of the interposer; and a plurality of first vias extending through both the upper and lower layers and electrically coupling the plurality of RF beamforming circuits to the plurality of antenna elements. A plurality of second vias extend between the RF beamforming circuits and the conductive traces, some of which interconnect the antenna elements with the combiner/divider network through the RF beamforming circuits. The wafer further includes at least one intermediate amplifier that amplifies a transmit signal or a receive signal routed through another one of the second vias from/to an intermediate point of the combiner/divider network and outputs the amplified transmit or receive signal back to the combiner/divider network through a further one of the second vias.

In another aspect, a method of fabricating an antenna apparatus involves sequentially applying an identical reticle image to each of a plurality of regions of a semiconductor wafer to thereby form respective tiles within each region, each tile including RF beamforming circuits having ion implanted transistor regions within the wafer and a metallization pattern on a surface of the wafer; and attaching an interposer to the wafer. The interposer includes a lower dielectric layer adjacent to the wafer, an upper dielectric layer, a metal layer between the lower and upper dielectric layers and including a plurality of conductive traces, a plurality of first vias extending through both the upper and lower layers, and a plurality of second vias extending between a lower surface of the interposer and the metal layer to interconnect the plurality of tiles. A radiating layer including a plurality of antenna elements is attached to or formed on an upper surface of the interposer such that the antenna elements are electrically coupled to the RF beamforming circuits through the plurality of first vias.

BRIEF DESCRIPTION OF THE DRAWINGS

The above and other aspects and features of the disclosed technology will become more apparent from the following detailed description, taken in conjunction with the accompanying drawings in which like reference characters indicate like elements or features. Various elements of the same or similar type may be distinguished by annexing the reference label with a dash and second label that distinguishes among the same/similar elements (e.g., −1, −2), or directly annexing the reference label with a second label. However, if a given description uses only the first reference label, it is applicable to any one of the same/similar elements having the same first reference label irrespective of the second label. Elements and features may not be drawn to scale in the drawings.

DETAILED DESCRIPTION OF EMBODIMENTS

The following description, with reference to the accompanying drawings, is provided to assist in a comprehensive understanding of certain exemplary embodiments of the technology disclosed herein for illustrative purposes. The description includes various specific details to assist a person of ordinary skill the art with understanding the technology, but these details are to be regarded as merely illustrative. For the purposes of simplicity and clarity, descriptions of well-known functions and constructions may be omitted when their inclusion may obscure appreciation of the technology by a person of ordinary skill in the art.

Herein, a substrate may be said to "include" circuitry, or "include circuitry formed therein", or the like, even though the circuitry may be only partially formed within the substrate (e.g., as doped regions of transistors or embedded conductors). A substrate that is said to include circuitry may also have conductive elements partially formed on a surface of the substrate.

Herein, a "beamforming circuit" may be any circuitry that contributes to forming an antenna beam. A beamforming circuit may be composed of one or more active components and/or one or more passive components. Examples of active components include an amplifier, a phase shifter, and a switch; examples of passive components include a filter, and a section of transmission line. A plurality of interconnected beamforming circuits may together form an RF front end that is coupled to an antenna array.

Figure 1:
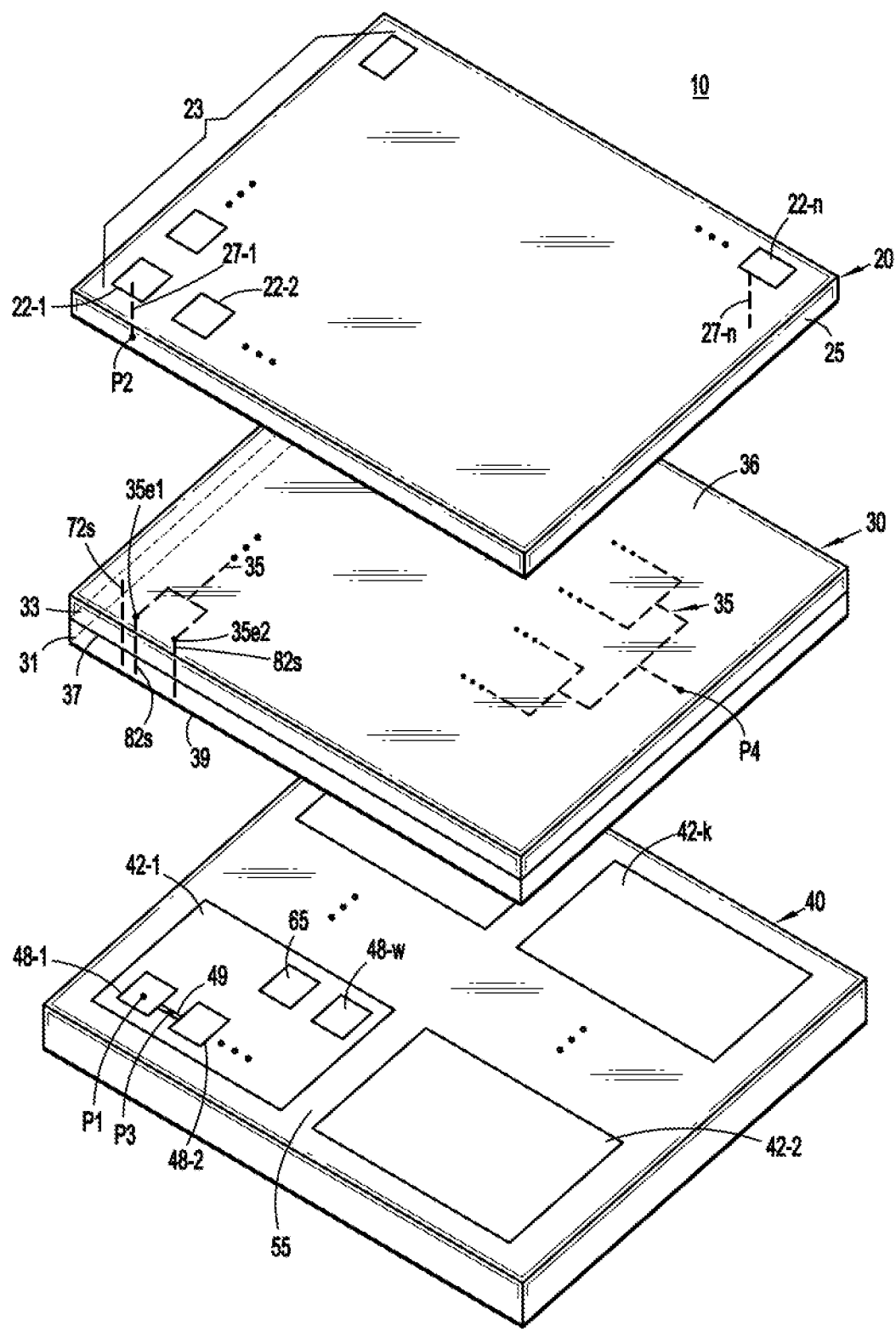
FIG. 1 is an exploded perspective view of an exemplary antenna apparatus according to an embodiment.

Herein, the term "via transition" denotes a set of two or more connections that includes at least one via, where the set of connections collectively make a transition from one transmission line or transmission mechanism to another transmission line or mechanism. A via transition may be a set of three vias of a ground-signal-ground (GSG) connection between coplanar waveguide (CPW), microstrip or stripline to a probe feed connected to an antenna element. A via transition may also be a GSG connection between CPW or microstrip to stripline, in which case the GSG connection comprises two vias and a ground-ground connection. In still other examples, a via transition that connects microstrip or CPW in one layer to microstrip in another layer can have just one via and one direct connection, FIG. 1 is an exploded perspective view of an antenna apparatus, 10, according to an embodiment. Antenna apparatus 10 includes a radiating layer 20, a wafer 40 and a multi-layer interposer 30 between radiating layer 20 and wafer 40. Antenna elements 22 of radiating layer 20 are coupled through interposer 30 to beamforming circuitry within wafer 40. Wafer 40 composed of a semiconductor material such as silicon, silicon germanium (SiGe), silicon carbide (SIC), gallium arsenide (GaAs), gallium nitride (GaN), or indium phosphide (InP). Interposer 30 may be composed of a material with a lower loss tangent than wafer 40, such as quartz or fused silica. Interposer 30 provides low loss routing and dividing/combining of RF signals between connections points within wafer 40, and also between wafer 40 and antenna elements 22. In one example, antenna apparatus 10 is configured for operation over a millimeter (mm) wave frequency band, generally defined as a band within the 30 GHz to 300 GHz range. In other examples, antenna apparatus 10 operates in a microwave range from about 1 GHz to 30 GHz, or in a sub-microwave range below 1 GHz. Herein, a radio frequency (RF) signal denotes a signal with a frequency anywhere from below 1 GHz to 300 GHz.

Radiating layer 20 may include "n" antenna elements 22-1 to 22-$n$ defining an antenna array 23, which are formed on an upper surface of a dielectric 25. The number n of antenna elements 22, their type, sizes, shapes, inter-element spacing, and the manner in which they are fed from the beamforming circuitry may be varied by design to achieve targeted performance metrics. Examples of such performance metrics include beamwidth, pointing direction, polarization, sidelobes, power loss, beam shape, etc., over a requisite frequency band. Antenna elements 22 may be microstrip patch antenna elements as illustrated in FIG. 1, or other radiator types such as printed dipoles or slotted elements. Depending on the application, antenna elements 22 may be connected to beamforming components for transmitting and/or or receiving RF signals. Connection of antenna elements 22-1 to 22-$n$ to the beamforming circuitry may be through probe feeds 27-1 to 27-$n$, respectively, which are formed within dielectric 25 and connect to other vias within interposer 30. Dielectric 25 may be a low loss material such as an air/honeycomb material that may be grown atomically layer by layer over interposer 30. As additional example, other materials such as liquid crystal polymer or quartz may be used.

Interposer 30 may comprise a low loss dielectric material such as quartz or fused silica. In one embodiment, interposer 30 has a stripline construction, in which case interposer 30 includes: an upper metal layer 36 formed on a top surface of an upper dielectric layer 33 and serving as both an upper ground plane for the stripline and a ground plane for antenna elements 22; a lower metal layer (lower ground plane) 39 formed on a bottom surface of a lower dielectric layer 31; and a metal (conductive) layer 37 between upper and lower dielectric layers 33, 31 to form a central conductor of the stripline construction. Each of the metal layers 39, 37 and 36 may be thin film metal layers. Upper metal layer 36 has openings therein through which probe feeds 27 connect to upper ends of vias 72$s$ and are isolated from the ground plane. Lower metal layer 39 also has openings through which lower ends of vias 72$s$ and 82$s$ penetrate. Vias 72$s$ connect the probe feeds 27 to connection points on wafer 40. Vias 72$s$ are each part of a respective GSG via transition 72 discussed below. Vias 82$s$ are blind vias that connect points of the central conductor of layer 37 to other connection points on wafer 40. Vias 82$s$ are each part of a respective via transition 82 also described later. Metal layer 37 is patterned to form a combiner/divider network 35 having a plurality of interconnected conductive traces each routing an RF signal. Combiner/divider network 35 combines and/or divides RF signals propagating between an input/output (I/O) connection point p4 and connection points on wafer 40 for further routing from/to antenna elements 22. For instance, in the transmit direction, combiner/divider network 35 functions as a divider to divide an input transmit signal at I/O point p4 among a plurality of divided signal paths, so that a corresponding plurality of divided transmit signals are provided at network end points 35$e$ such as 35$e$1 and 35$e$2. In the receive direction, combiner/divider network 35 functions as a combiner to combine receive signals received at the end points 35$e$ into a composite receive signal which is output at I/O point p4.

In other embodiments, interposer 30 has a microstrip construction, in which case lower ground plane 39 may be substituted with a patterned metal layer forming the conductor of the microstrip transmission line. In this case, central metal layer 37 may be omitted and upper ground plane 36 may serve as both the microstrip ground plane and a ground plane for antenna elements 22. In still other embodiments, a coplanar waveguide (CPW) transmission line is used within interposer 30, in which case lower ground plane 39 is substituted with CPW conductors, central metal layer 37 may be omitted, and upper ground plane 36 remains. In yet another embodiment, central metal layer 37 is patterned to form a conductor of a microstrip transmission line of interposer 30, and the lower ground plane 39 is the ground of the microstrip transmission line. In this case, vias 82s would connect the microstrip conductor to a signal line within wafer 40, and a direct ground-ground connection would be made between ground plane 39 and a ground of wafer 40. In another example, central metal layer 37 is CPW, and three vias are used in a GSG connection between the CPW and CPW or microstrip within wafer 40.

Wafer 40 is an example of a semiconductor substrate within which all active beamforming circuitry between a single RF input/output port (e.g., p4) and antenna array 23 is contained. This approach is contrary to conventional configurations in which individual chips with beamforming circuitry are attached to a substrate. In an embodiment, wafer 40 is said to be an "array sized" substrate by having a form factor approximately equaling that of antenna array 23. For instance, antenna array 23 may be comprised of tens, hundreds or over a thousand antenna elements 22, all coupled to beam forming circuitry of a single wafer 40 through interposer 30. Wafer 40 may include a number "k" of "tiles" 42-1 to 42-k formed therein, where each tile 42 includes one or more sub-circuits 48 (interchangeably, "beamforming circuits") such as "w" sub-circuits 48-1 to 48-w included within tile 42-1. Herein, a tile denotes circuitry formed within a wafer using a reticle-based image applied to a single region (hereafter, a "tile region"). (An example of tile formation using a reticle is described below in connection with FIG. 5.) In an embodiment, all tiles 42 have an identical design, with the same overall circuit configuration, numbers of sub-circuits 48 and physical layout. In other embodiments, some of the tiles 42 differ from one another. A "saw street" 55 exists between adjacent tiles 42, which is an isolation region on the wafer 40 without metallization. Interconnects may be provided within interposer 30 to connect adjacent tiles 42 across saw streets 55. For instance, conductive traces of combiner/divider 35, in conjunction with via transitions 82, may serve as such interconnects, which effectively interconnect sub-circuits 48 of different tiles of wafer 40. In conjunction with such interposer interconnects to interconnect tiles 42 across saw streets 55, a large number of beamforming circuits 48 can be integrally formed within a single wafer 40 without dicing and re-attaching individual chips, thereby facilitating the manufacturing process. Moreover, wafer real estate otherwise allocated for a combiner/divider network can be freed up for other circuitry or purposes.

It is noted here that in other examples of a large scale antenna array, multiple wafers 40 are arranged side by side to form a multi-wafer subassembly, and a single interposer 30 is bonded to the multiple wafers 40 to interconnect the large numbers of antenna elements to the beam forming circuitry distributed over the multi-wafer subassembly.

Any sub-circuit 48 may include beamforming circuitry with ion implanted transistor regions internally formed within wafer 40. The beamforming circuitry includes front-end beamforming components such as a transmit path amplifier, a transmit path phase shifter, bandpass filters, a receive path low noise amplifier (LNA), a receive path phase shifter, transmit/receive (T/R) switches, and/or an "on-wafer" combiner/divider or portions thereof. Any sub-circuit 48 may be referred to as a "chip-unit" with beamforming circuitry that would be traditionally incorporated into an individual chip diced from a wafer and re-attached to a substrate. With the present technology, by forming many sub-circuits 48 within a single wafer 40 without dicing chips from a wafer and reattaching them to a substrate, a manufacturing process for forming antenna apparatus 10 is streamlined. Further, interconnects like wire-bonds to connect individual chips to a substrate are avoided, thereby reducing inductance and improving reliability.

Any sub-circuit 48 may electrically connect to one or more antenna elements 22 through a respective one or more vias 72s. For instance, sub-circuit 48-1 of tile 42-1 may have a connection point p1 that connects, through a via 72s (part of a via transition 72), to a connection point p2 of probe feed 27-1 for antenna element 22-1. In an embodiment, some or all end points 35e of combiner/divider 35 connect through a respective via 82s to an "on-wafer" combiner/divider 49, which in turn routes signals to/from two or more sub-circuits 48. For instance, end point 35e1 connects through a first via 82s to a connection point p3 of combiner/divider 49, whereas end point 35e2 connects to a second via 82s to another combiner/divider 49 (not shown). To divide a transmit signal, such an on-wafer combiner/divider 49 receives the transmit signal at an input path and divides it among multiple output paths, each connected to a respective sub-circuit 48. A reciprocal combining operation may be performed for receive path signals. In other embodiments, combiner/dividers 49 are omitted and every end point 35e is connected directly to a respective sub-circuit 48 through a via 82s.

In an embodiment, some or all tiles 42 include at least one sub-circuit 65 that functions as an intermediate amplifier. Sub-circuit 65 amplifies a transmit signal or a receive signal routed through a via 82s from/to an intermediate point of combiner/divider 35 (other than an end point 35e) and then outputs/re-routes the amplified signal back to combiner/divider 35 at another intermediate point through another via 82s.

Figure 2:
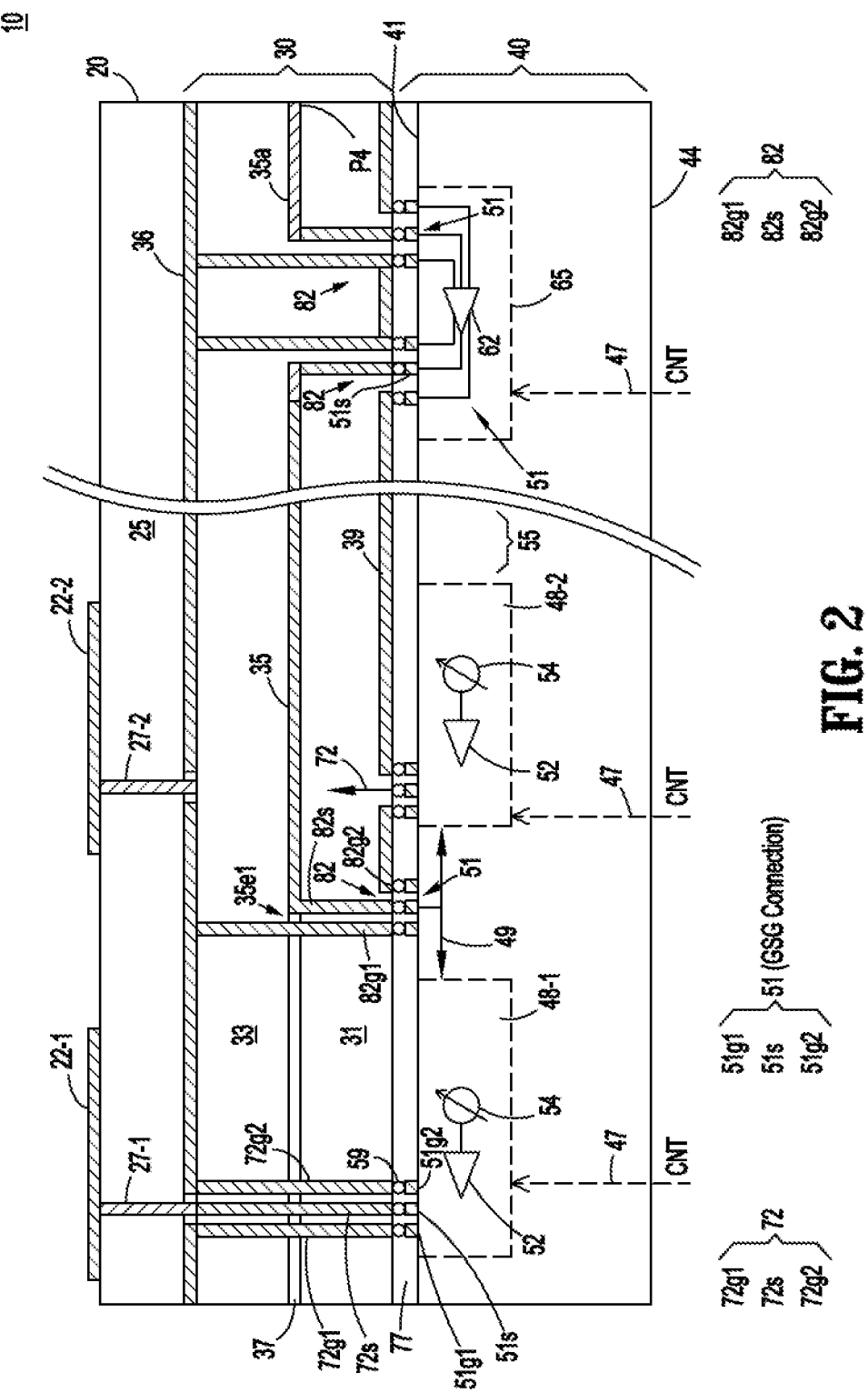
FIG. 2 illustrates an exemplary configuration of the antenna apparatus of FIG. 1 in an assembled state, depicted in a cross-sectional view.

FIG. 2 illustrates an exemplary configuration of a portion of antenna apparatus 10 in an assembled state, depicted in a cross-sectional view. (Note that detailed examples of interconnections and operational signal flow within the antenna apparatus 10 are described below in connection with FIGS. 6-9.) In this example, wafer 40 electrically and mechanically connects to interposer 30 through a large number of solder balls (or copper pillars) 59 connected between lower metal layer 39 of interposer 30 and top surface 41 of wafer 40. For example, in the case of a large antenna array 23, solder balls 59 may number in the thousands. Interposer 30 further includes thin film metal layer 36 that may have been formed by electroplating on a top surface of upper layer 33, Radiating layer 20 may have been bonded to metal layer 36 by atomically growing multiple layers of an air/honeycomb dielectric material of dielectric 25 atop metal layer 36. Alternatively, a pre-cut slab of dielectric 25 is fused to metal layer 36 through direct bond interconnect (DBI) bonding, thermal compression bonding or other suitable process. If a fusing method is used, metal layer 36 may alternatively be formed first on the lower surface of dielectric 25 instead of the upper surface of interposer 30.

The example of FIG. 2 depicts two sub-circuits. 48-1 and 48-2 which are part of the same tile 42, and a sub-circuit 65 which may be part of the same tile or a different tile 42. Radiating layer 20 includes antenna elements 22-1, 22-2 connected to probe feeds 27-1, 27-2, each in turn connecting to a via 72s. This example illustrates via transition 72 embodied as a set of three vias that form part of a GSG connection: a "signal via" 72s, a first "ground via" 72g1, and a second ground via 72g2. Signal via 72s is connected on one end to probe feed 27-1 and on an opposite end to a "signal contact" 51s of sub-circuit 48-1 through a solder ball 59. Signal contact 51s, in conjunction with a first ground contact 51g1 and a second ground contact 51g2 on opposite sides thereof, forms a set of GSG contacts 51. First and second ground vias 72g1, 72g2 connect on one end through a respective solder ball 59 to first and second ground contacts 51g1, 51g2, respectively, and on an opposite end to ground plane 36. In the stripline configuration, a via transition 82 may serve as a stripline to CPW, stripline to microstrip or stripline to stripline transition, depending on the type of transmission line interface within wafer 40. In either case, each via transition 82 may include a signal via 82s (a blind via) connected between the central conductor within layer 37 and a signal contact 51s; a ground via 82g1 connected between ground plane 36 and a ground contact 51g1; and an adjacent connection (through a solder ball 59) between ground contact 51g2 and lower ground plane 39. In this manner, signal energy freely flows between the stripline of interposer 30 and the CPW, microstrip or stripline interface of wafer 40. Herein, signal vias 72s are examples of "first vias" and signal vias 82s are examples of "second vias".

Each sub-circuit 48 includes one or more beamforming components such as an amplifier 52 and a phase shifter 54. Sub-circuits 48 of different tiles 42 are effectively interconnected by vias 82s connecting to combiner/divider 35. Any sub-circuit 48 may receive control signals or bias signals CNT on a control line(s) 47, to control one or more active components therein. Control lines 47 may connect to an external component through an input terminal on a bottom surface 44 of wafer 40. The beamforming components of a sub-circuit 48 may modify (e.g., amplify, phase shift, and/or filter) a transmit signal received from combiner/divider 35 through on-wafer combiner/divider 49, and output the modified transmit signal to a respective antenna element 22. A reciprocal operation may occur in the receive path direction with the use of T/R switches (not shown) and/or circuitry to implement a full-duplex or other transmit-receive isolation scheme. If combiner/divider 49 is implemented as CPW, the conductors of the CPW or the microstrip conductor may have been formed on surface 41 of wafer 40 as illustrated. Since solder balls 59 have a diameter large enough to create a gap 77 between the opposing surfaces of wafer 40 and interposer 30, the gap 77 may be sufficient to prevent ground plane 39 from shorting or adversely affecting the signals carried by the CPW or microstrip conductors.

In some examples, a sub-circuit 48 may further include a divider (not shown) that divides the modified transmit signal (e.g., output by amplifier 52) to feed two or more antenna elements 22. Such a divider may perform a reciprocal combining operation in the receive direction.

In the example of FIG. 2, combiner/divider 35 has an input signal path 35a that is broken at the metal layer 37 level and routed down through a via transition 82 to a transmit amplifier 62 of a sub-circuit 65. The amplified transmit signal output by amplifier 62 is then routed back to combiner/divider 35 through another via transition 82. For instance, if the input signal path 35 is relatively long and lossy, amplifier 62 may restore the magnitude of the transmit signal to a desirable level. In the receive direction, a receive path amplifier (not shown) may be similarly deployed within sub-circuit 65. In this case, T/R switches or other isolation circuitry may be included within sub-circuit 65 to isolate the transmit and receive signals. I/O point p4 may receive the input transmit signal and/or output the receive signal through a connector (not shown) attached at a side surface of interposer 30. In another example, an I/O connector (not shown) is attached at the bottom surface 44 of wafer 40. In this case, I/O point p4 may connect to the I/O connector through another via transition 82. The latter via transition 82 would connect to wafer 40 at a connection point corresponding to a top end of a via in wafer 40, or a coaxial feedthrough in wafer 40. The bottom end of the via or feedthrough in wafer 40 would connect to the I/O connector at the bottom surface 44.

In general, sub-circuits 48 of the same or different tiles may be connected to each other for RF signal and/or control signal routing through interconnect paths of interposer 30. An interconnect path between sub-circuits 48 may be formed at the metal layer 37 by using blind vias such as 82s, and/or another metal layer at a different level (not shown) within interposer 30. If sub-circuits 48-1 and 48-2 of FIG. 2 are alternatively sub-circuits of different tiles 42, a saw street region 55 exists between the tiles 42. Since no metallization is applied to the top surface 41 of wafer 40 in saw street region 55, "inter-tile" connections between sub-circuits 48 may be made through interposer 30 in this manner through layer 37.

Figure 3:
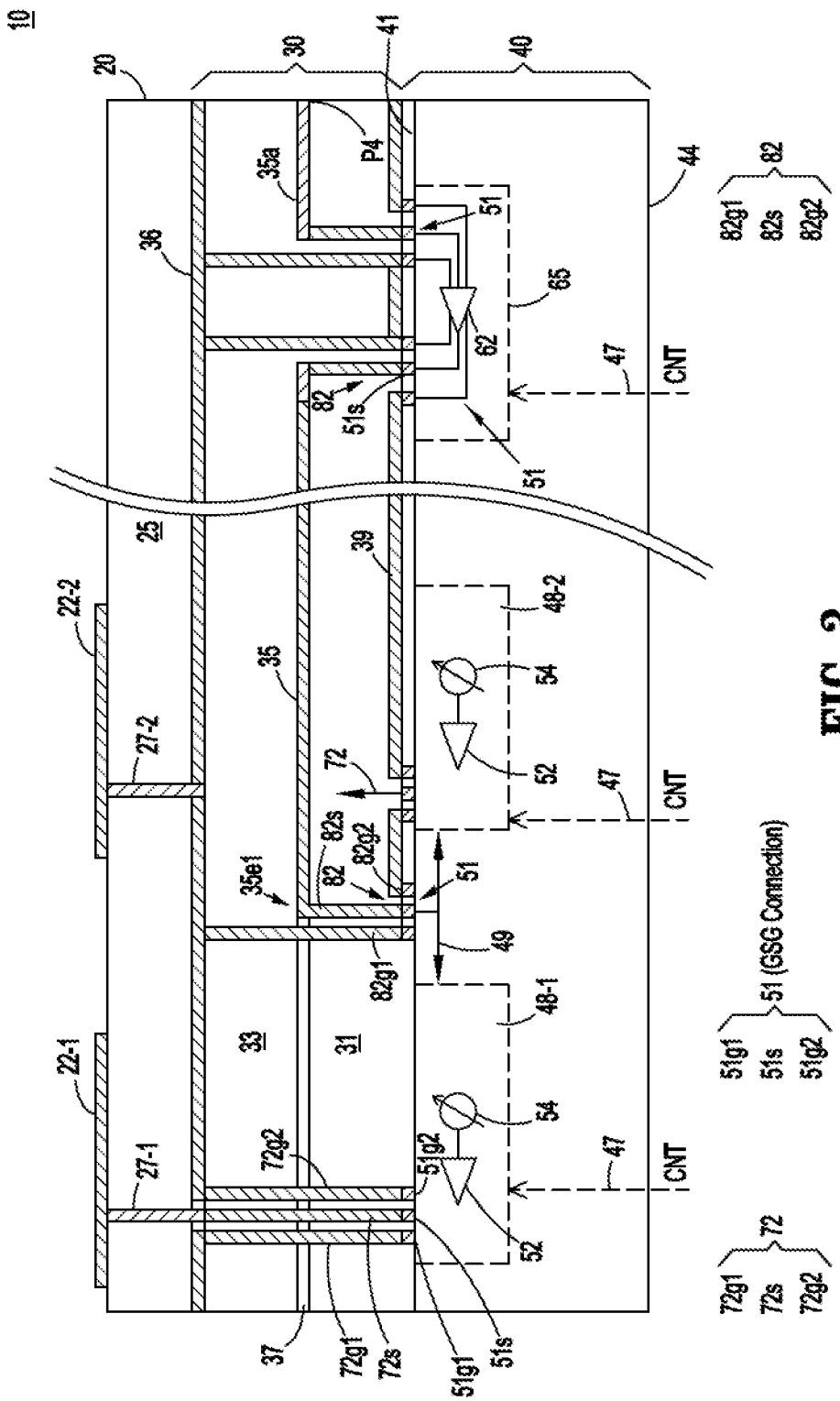
FIG. 3 illustrates another exemplary configuration of the antenna apparatus in an assembled state depicted in a cross-sectional view.

FIG. 3 illustrates another exemplary configuration of antenna apparatus 10 in an assembled state. This configuration differs from that of FIG. 2 by omitting solder balls 59 and instead forming a direct bond between interposer 30 and wafer 40, e.g., through a DBI bonding method. This results in a direct bonding of via transitions 72, 82 of interposer 30 to metal contacts 51 of wafer 40. In large antenna arrays, this approach eliminates thousands of solder balls 59, thereby improving reliability of antenna apparatus 10. To avoid shorting between ground plane 39 and conductive elements on surface 41 (e.g., a CPW or microstrip inner conductor on surface 41), an isolation layer may have been deposited atop any conductor on or near wafer surface 41.

Figure 4:
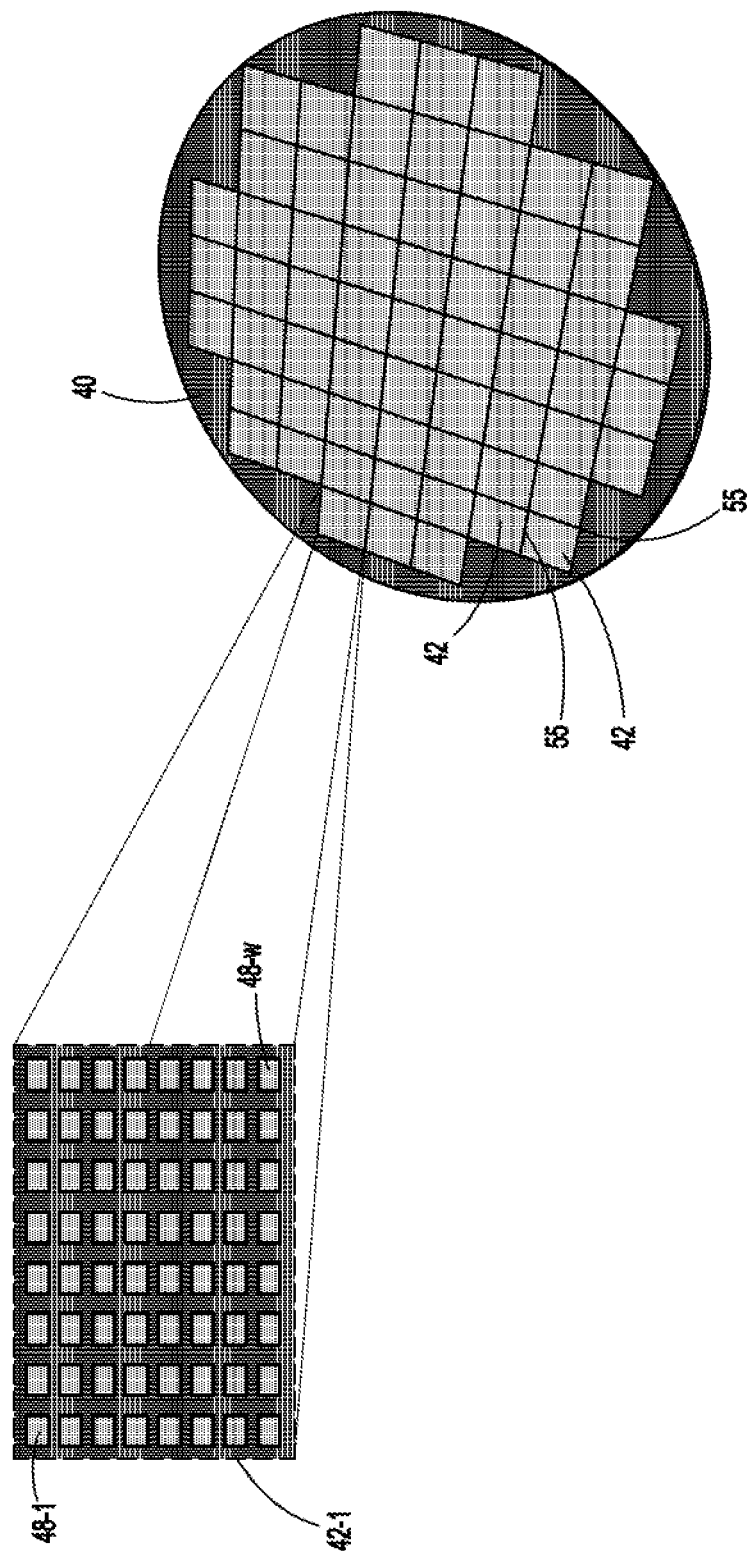
FIG. 4 illustrates an exemplary tile arrangement on a wafer and a tile configuration of the antenna apparatus.

FIG. 4 illustrates an exemplary tile arrangement on a wafer and an exemplary tile configuration of antenna apparatus 10. As mentioned, a tile denotes circuitry formed within a wafer with the use of a reticle-based image applied to a specific physical surface, herein referred to as a "tile region". As illustrated, a disc-shaped wafer 40 may have tiles 42 formed in rows and columns, with saw streets 55 between adjacent tiles 42. The tiles 42, however, are not cut from wafer along the saw streets 55, contrary to conventional designs. A tile such as 42-1 may include a grid layout of sub-circuits 48-1 to 48-w (of which one or more may be a sub-circuit 65 discussed earlier). In some examples, only complete rectangular or square tiles 42 are formed as part of wafer 40, leaving some peripheral surface area of wafer 40 unused. In other examples, additional sub-circuits may be formed at the circular perimeter of the wafer.

Figure 5:
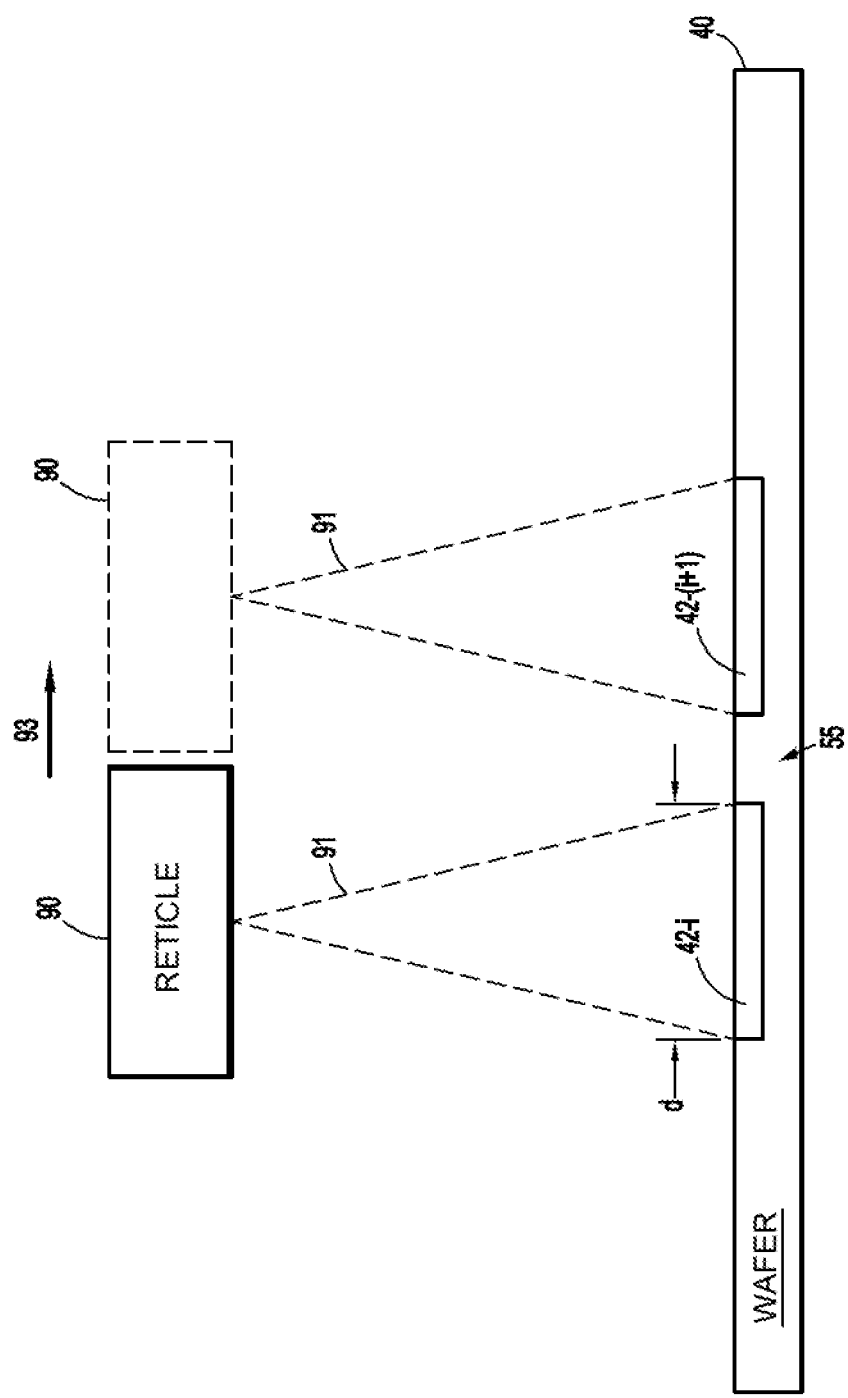
FIG. 5 schematically illustrates how tiles of a wafer of the antenna apparatus may be formed using a reticle.

FIG. 5 schematically illustrates how tiles of wafer 40 may be formed using a reticle. A reticle 90 is a tool that produces a photolithographic image 91 that patterns a film or mask (already deposited on the wafer) to expose regions for processing and ultimately form a complete circuit after many process steps. Image 91 has a span "d" that is typically limited in extent to only a portion of a wafer 40's diameter. Typically, the span d is less than half the wafer 40's diameter in order to generate a circuit image at the wafer 40 surface with a target resolution. In some cases, an identical image may be generated in tile regions across wafer 40 by stepping reticle 90 laterally and repeating the illumination with the same image 91. (In other examples, different images could be used in different respective regions of wafer 40 as part of the same processing phase.) Thus, in FIG. 5, as part of a first exposure step, reticle 90 initially produces a first image 91 to generate a first exposure for tile 42-$i$. Reticle 90 is then laterally translated as illustrated by path 93 and produces a second image 91 which is typically the same as the first image, to produce a first exposure for second tile 42-($i$+1). The process may be repeated for all tile regions of wafer 40. Then, a first processing step such as ion implantation for doping transistor regions, or electroplating to deposit a first metallization layer, may be performed simultaneously on wafer 40 for all tile regions. Next, another mask or film may be deposited on the wafer 40 surface and reticle 90 may be again controlled to begin a second round of tile region to tile region exposures corresponding to a second processing step, and so on, until all processing steps are completed. In the overall process, saw streets 55 between the adjacent tiles are formed, which are isolation regions without metal, traditionally used to dice tiles or individual chips from the wafer. In the present embodiments, no dicing between tiles 42 is performed, thereby producing wafer 40 as a continuous substrate with many tiles 42 formed therein.

Figure 6:
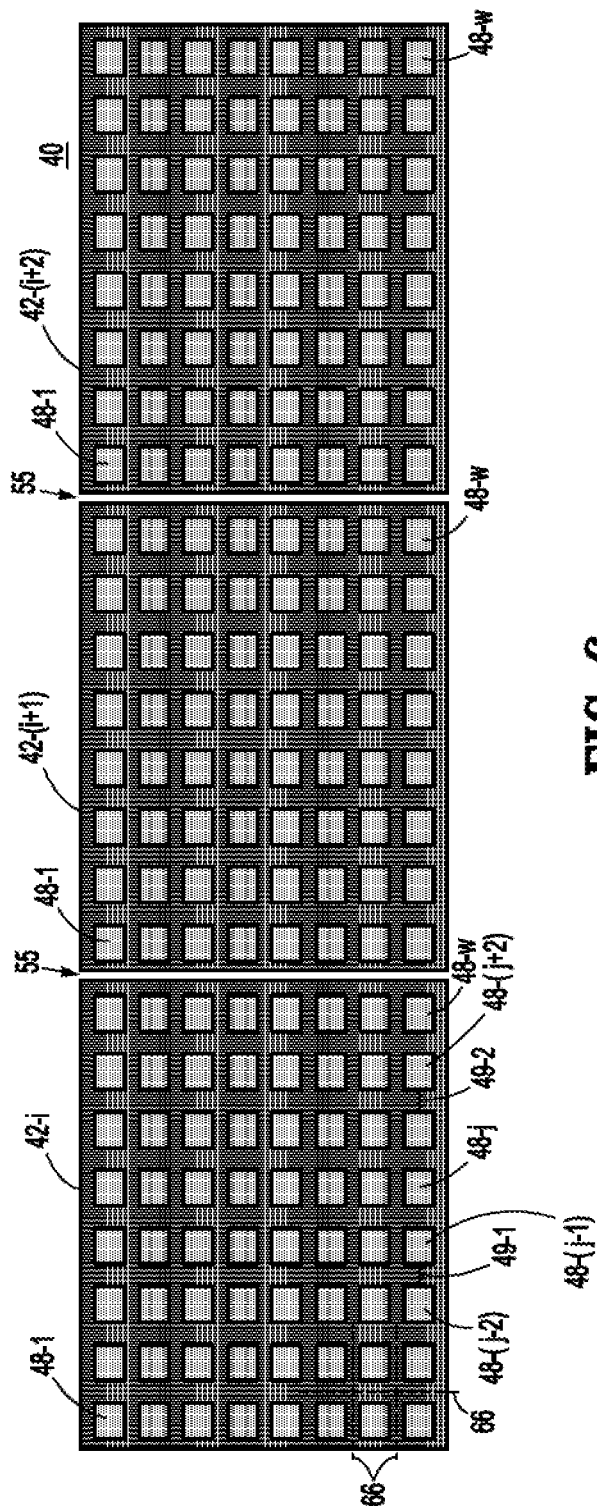
FIG. 6 depicts an exemplary layout of consecutive tiles on a wafer.

FIG. 6 depicts an exemplary layout of consecutive tiles on a wafer 40 of antenna apparatus 10 according to an example. Tiles 42-$i$, 42-($i$+1) and 42-($i$+2) are arranged in a given row of wafer 40, with saw streets 55 between adjacent tiles. Each tile 42 may have a plurality of interconnected sub-circuits 48-1 to 48-$w$, which, to form conventional devices, would be diced from the wafer along regions 66 (and also along saw streets 55) to form individual chips that would be re-attached to a substrate. In the present embodiments, no chips are diced and each tile such as 42-$i$ may have a plurality of on-wafer combiner/dividers such as 49-1 and 49-2.

Figure 7A:
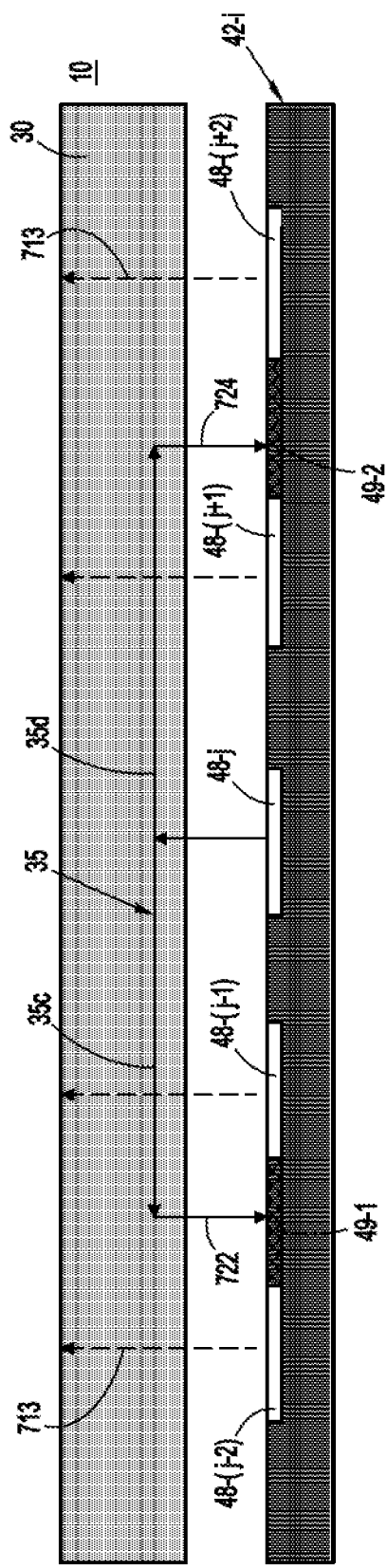
FIG. 7A illustrates an example connection configuration between sub-circuits of a common tile and signal routing in an antenna apparatus according to an embodiment.
Figure 7B:
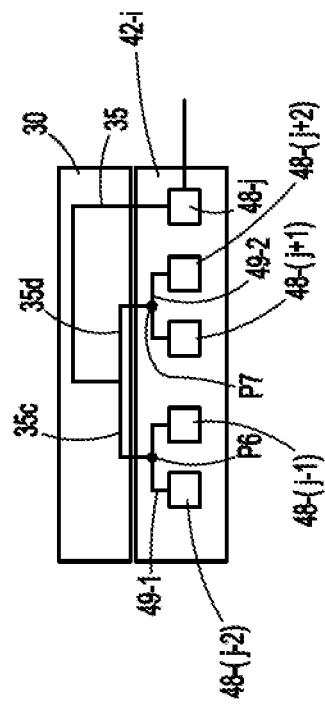
FIG. 7B is a functional diagram depicting signal splitting and routing in the embodiment of FIG. 7A.
Figure 8:
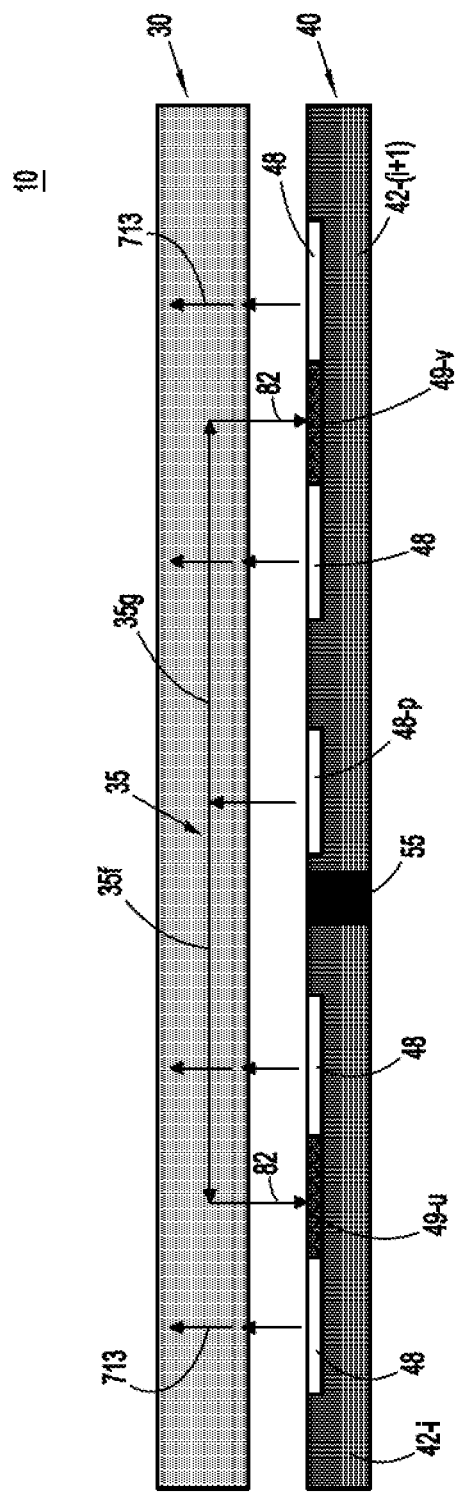
FIG. 8 illustrates an exemplary connection configuration between sub-circuits of different tiles and signal routing in an antenna apparatus according to an embodiment.

FIG. 7A schematically illustrates an exemplary connection and signal flow among sub-circuits 48 within the same tile such as 42-$i$ of FIG. 6, interconnected using interposer 30, FIG. 7B is a functional block diagram for this example. In the transmit direction, an RF signal output from sub-circuit 48-$j$ is divided between paths 35$c$ and 35$d$ of combiner/divider 35 within interposer 30. The divided signals are re-routed back to wafer 40 through respective paths 722, 724 (e.g., via transitions 82), which connect to on-wafer dividers 49-1, 49-2 at points p6 and p7, respectively. On-wafer dividers 49-1, 49-2 each divide the signals again among multiple paths, and these divided signals are provided to adjacent sub-circuit pairs (48-($j$−2), 48-($j$−1)) and (48-($j$+1), 48-($j$+2)), respectively. Each sub-circuit 48 may modify the input signal and output the modified signal through interposer 30 to an antenna element 22 as depicted by paths 713. Reciprocal signal flow may occur in the receive direction, FIG. 8 schematically illustrates an exemplary connection configuration between sub-circuits of different tiles and signal routing across tiles in antenna apparatus 10 according to an embodiment. In the transmit direction, an RF signal originating from a sub-circuit 48-P of a tile 42-($i$+1) is output through interposer 30 and split among paths 35$f$ and 35$g$ of combiner/divider 35, Path 35$f$ traverses over saw street 55 and connects through a via transition 82 to an on-wafer divider 49-$u$ of an adjacent tile 42-$i$, Path 35$g$ traverses over tile 42-($i$+1) and connects through another via transition 82 to an on-wafer divider 49-$v$. The on-wafer dividers 49-$u$, 49-$v$ split the signals again between adjacent sub-circuits 48 for modification and outputting to antenna array 23. Reciprocal signal flow may occur in the receive direction.

Figure 9:
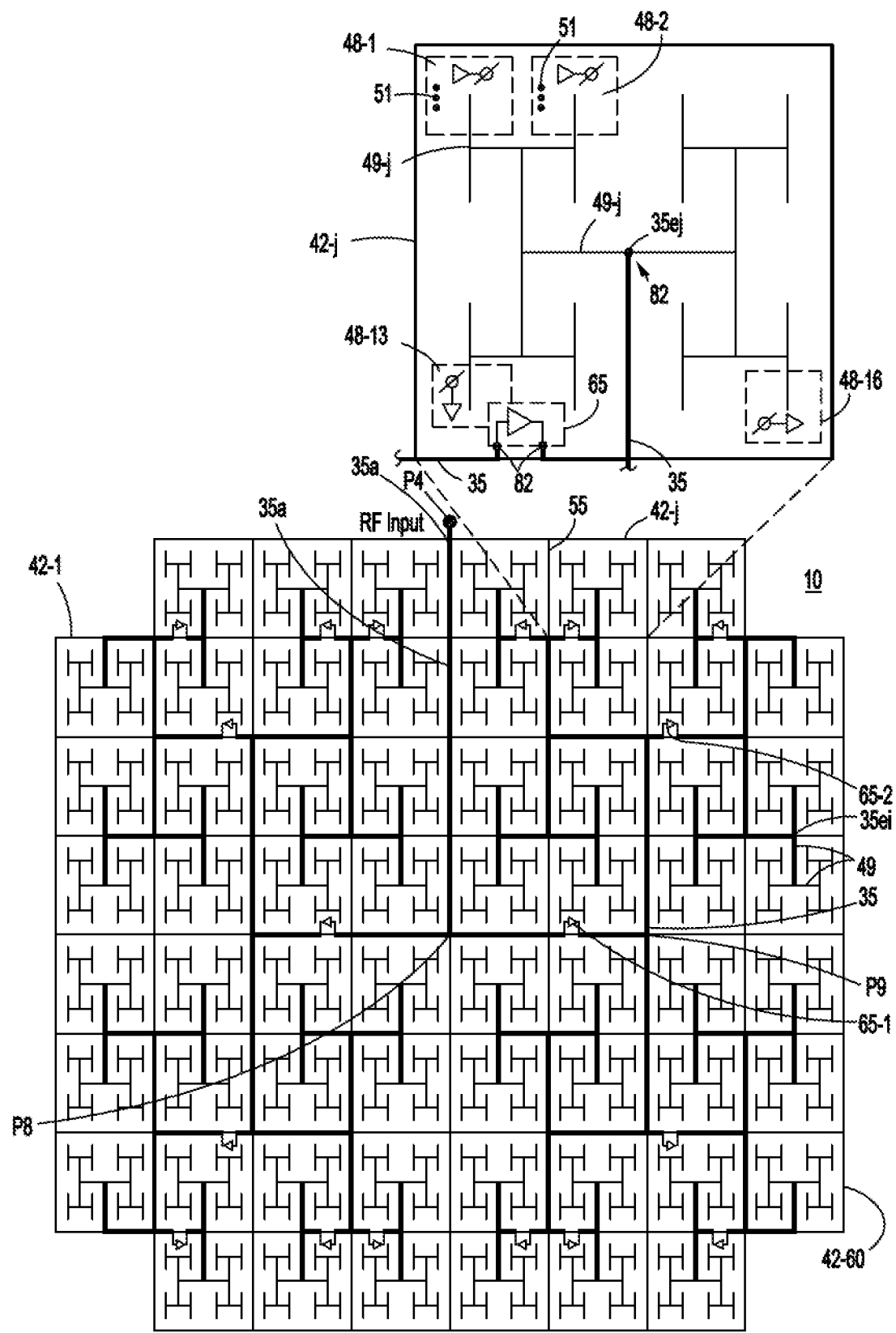
FIG. 9 illustrates an exemplary tile layout with a signal routing example according to an embodiment.

FIG. 9 illustrates an exemplary tile layout along with a signal routing example according to an embodiment of antenna apparatus 10. In this example, a wafer 40 includes a grid layout of sixty tiles 42-1 to 42-60, with one tile omitted from each corner of a square profile. Each tile such as 42-$j$ ($j$=any number from 1 to 60) may have an identical design and include sub-circuits 48-1 to 48-16 with RF front-end circuitry, and another sub-circuit 65 (hereafter, just "amplifier 65") with an intermediate amplifier 62 to provide intermediate amplification. Each sub-circuit 48 may include a set of contacts 51 as described above to connect to a respective antenna element 22 through a via transition 72. The thick lines in FIG. 9 represent paths of an exemplary combiner/divider 35 within interposer 30. An RF I/O connection point p4 located within interposer 30 near a centralized edge of wafer 40 connects to an input path 35$a$. Input path 35$a$ extends to a centralized point p8 of interposer 30, where it divides to feed left side and right side tiles 42. In a transmit path example, a transmit signal is re-routed by a via transition 82 from combiner/divider 35 to an amplifier 65-1 of a tile 42 on each side. There, it is amplified and routed back to combiner/divider 35 by another via transition 82 for further division at a point p9 towards tiles in upper and lower quadrants. Downstream, further division by combiner/divider 35 and amplification by amplifiers such as 65-2 may occur as necessary or desired to restore the divided transmit signals to a suitable level.

As seen in the enlarged view of tile 42-$j$, a transmit signal destined for tile 42-$j$ may be routed from interposer 30 to an intermediate amplifier 65 through a via transition 82 and amplified. The amplified output may be routed back up to combiner/divider 35 where it may divide into two paths, one of which may terminate at an end point 35$ej$. There, another via transition 82 may route the signal back to on-wafer combiner/divider 49-$j$. In this example, combiner/divider 49-$j$ is a 1:16 power divider/combiner with 16 termination points connected to respective sub-circuits 48-1 to 48-16 for transmission through antenna elements 22. Reciprocal operations may occur in the receive paths from antenna elements 22. It is noted that although an identical one or more amplifiers 65 may be provided in each tile 42, some amplifiers 65 may be actively used whereas others are unused (unconnected and/or turned off). A selection of which amplifiers 65 to use, and how to bias them for variable amplification, may depend on the overall layout of the tiles 42 and a target electric field (antenna current) distribution across the aperture of antenna array 23. For example, instead of designing for a uniform electric field distribution, outer antenna elements may be fed with less RF power to achieve a target antenna pattern with lower sidelobes.

Figure 10:
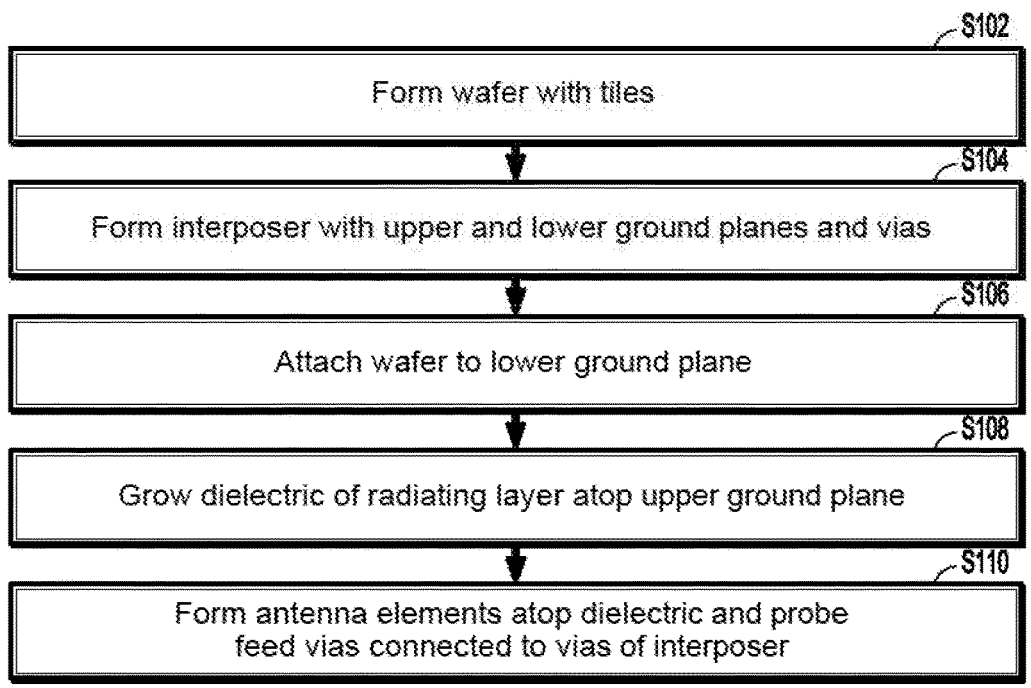
FIG. 10 is a flow diagram of an exemplary method for forming an antenna apparatus according to an embodiment.

FIG. 10 is a flow diagram of an exemplary method of forming antenna apparatus 10 having an interposer with stripline construction. The order of the various process steps of the method may be changed as desired. A wafer 40 is formed with multiple tiles (S102) using a reticle as described above with respect to FIG. 5. An interposer 30 with a stripline construction is formed (S104), where the interposer includes upper and lower ground planes and vias (e.g. blind vias 82$s$ and "complete vias" 82$g$1, 72$s$, 72$g$1, 72$g$2 extending completely between lower and upper surfaces of the interposer).

The wafer is attached to the interposer's lower ground plane (S106) using either the solder ball connection scheme (FIG. 2) or the direct attachment method (FIG. 3) described earlier. A dielectric layer of radiating layer 20 may be grown (S108) atop the upper ground plane. The material of the dielectric layer may be an air/honeycomb material grown atomically layer by layer. Once the dielectric layer is completed, antenna elements may be formed atop the dielectric layer and probe feed vias may be formed through the dielectric layer (S110), thereby completing the antenna apparatus 10 fabrication. The probe feed vias connect on one end to the antenna element metallization and on the opposite end to the top metallization of the interposer signal vias 72s.

Figure 11:
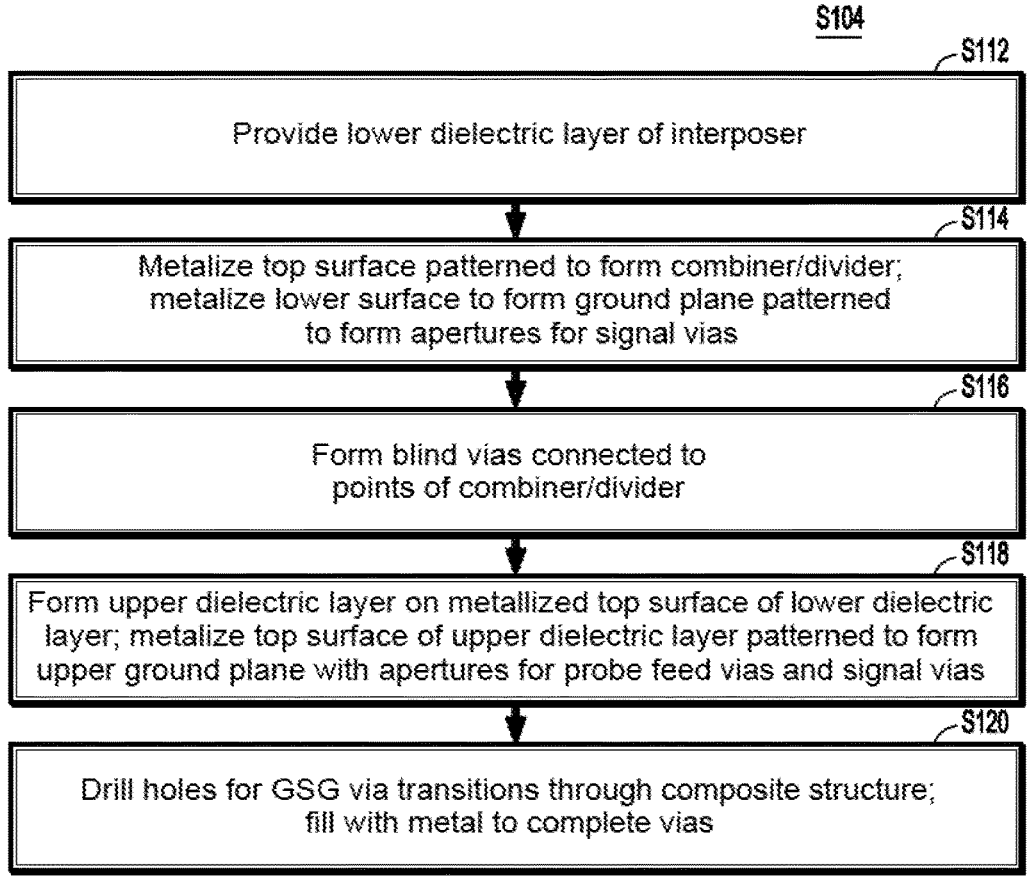
FIG. 11 is a flow diagram of an exemplary method for forming an interposer of the antenna apparatus.

FIG. 11 is a flow diagram of exemplary process steps for forming the interposer of the method of FIG. 10, representing an example for process S104. The order of the various process steps of this method may be changed as desired. A lower dielectric layer of the interposer is provided (S112). The top surface of the lower dielectric layer is metallized (S114) in a pattern to form combiner/divider 35; and the bottom surface of the lower dielectric layer is metallized with a pattern to form the lower ground plane 39 with apertures for signal vias 72s and 82s. The apertures prevent the signal vias from shorting to the lower ground plane. Thus, in the region of each signal via 72s and 82s, a metallized pattern may be formed with a centralized metal disc or square for a via pad, surrounded by an isolation ring with metal removed, which is in turn surrounded by ground plane metal.

Blind vias 82s of via transitions 82, connected to points of the combiner/divider 35, may be formed (S116). The upper dielectric layer of the stripline may then be formed or attached on the metallized top surface of the lower substrate (S118). The top surface of the dielectric layer may be metallized in a pattern to form the upper ground plane with similar apertures to allow an isolated connection between the probe feed vias and the signal vias 72s. Holes may then be drilled for the via transitions 72 and the complete vias 82g1 of via transitions 82; and the holes are filled with metal to complete the formation of the vias (S120), thereby completing the interposer 30 fabrication.

Embodiments of antenna apparatus as described above may be formed with a low profile and achieve superior performance (e.g., lower loss and higher frequency operation) as compared to conventional designs. Further, the construction is amenable to a facilitated manufacturing process. By providing an interposer with vias to interconnect reticle-image-based tiles across saw street isolation regions, a large number of beamforming circuits can be internally formed within a single wafer. An array-sized wafer with beamforming circuits may thereby be fabricated without the need to dice and re-attach individual chips to a substrate. Furthermore, regions within the wafer otherwise allocated for a combiner/divider network can be freed up for other purposes.

While the technology described herein has been particularly shown and described with reference to example embodiments thereof, it will be understood by those of ordinary skill in the art that various changes in form and details may be made therein without departing from the spirit and scope of the claimed subject matter as defined by the following claims and their equivalents.

What is claimed is:

1. An antenna apparatus comprising:
    a radiating layer comprising a plurality of antenna elements forming an antenna array;
    a semiconductor wafer comprising a plurality of tiles each having beamforming circuits; and
    a multi-layer interposer comprising:
        a lower dielectric layer adjacent to the wafer;
        an upper dielectric layer adjacent to the radiating layer;
        a metal layer between the lower and upper dielectric layers and comprising a plurality of conductive traces;
        a plurality of first vias extending through both the upper and lower dielectric layers and electrically coupling the beamforming circuits to the plurality of antenna elements; and
        a plurality of second vias extending between the beamforming circuits and the conductive traces to interconnect the plurality of tiles.

2. The antenna apparatus of claim 1, wherein the wafer further comprises saw streets separating the plurality of tiles from one another.

3. The antenna apparatus of claim 1, wherein each of the plurality of tiles has an identical circuit configuration formed through an identical reticle-generated image.

4. The antenna apparatus of claim 1, wherein the first vias are each a signal via of a ground-signal-ground (GSG) via transition that further comprises a first ground via on one side of the signal via and a second ground via on another side of the signal via.

5. The antenna apparatus of claim 4, wherein:
    the multi-layer interposer has a stripline construction comprising a first dielectric layer, a second dielectric layer, a lower ground plane between the wafer and the lower dielectric layer, and an upper ground plane between the upper dielectric layer and the radiating layer, the upper ground plane serving as a ground plane for the antenna elements;
    wherein the first and second ground vias are respectively connected on one end to respective first and second ground contacts on the wafer and are each connected on an opposite end to the upper ground plane.

6. The antenna apparatus of claim 5, wherein the second vias are each a signal via of a via transition that further comprises a ground via connecting a third ground contact of the wafer to the upper ground plane and a ground-ground connection connecting a fourth ground contact of the wafer to the lower ground plane.

7. The antenna apparatus of claim 1, wherein the conductive traces of the metal layer are part of a combiner/divider network that divides a radio frequency (RF) transmit signal received at an input/output (I/O) connection point of the interposer into a plurality of divided RF transmit signals each routed to one or more of the beamforming circuits using a respective one of the second vias at a respective end point of the combiner/divider network.

8. The antenna apparatus of claim 7, wherein the RF transmit signal is received at the I/O connection point from a connection point on the wafer, using a further via within the interposer.

9. The antenna apparatus of claim 7, wherein:
    each of the divided transmit signals is routed to a respective tile of the plurality of tiles at the respective end point of the combiner/divider network; and
    the respective tile further comprises an on-wafer combiner/divider, electrically connected to the respective end point, that further divides the divided transmit signal routed to the respective tile into at least two further divided transmit signals and routes each of the further divided transmit signals to a respective one of the beamforming circuits of the respective tile.

10. The antenna apparatus of claim 1, wherein the plurality of conductive traces form a combiner/divider network, and at least one of the plurality of tiles includes an intermediate amplifier that amplifies a transmit signal or a receive signal routed by the combiner/divider network, through another via within the interposer, from/to an intermediate point of the combiner/divider network and outputs the amplified transmit or receive signal back to the combiner/divider network through a further via.

11. The antenna apparatus of claim 1, wherein the plurality of conductive traces form a combiner/divider network, and each of the plurality of tiles includes an intermediate amplifier connectable on an input side through another via within the interposer to a respective intermediate point of the combiner/divider network and an output side connectable through a further via to another respective intermediate point of the combiner/divider network, each intermediate amplifier configured to selectively amplify a transmit signal or a receive signal routed by the combiner/divider network.

12. The antenna apparatus of claim 1, wherein the plurality of conductive traces form a combiner/divider network that combines a plurality of radio frequency (RF) receive signals received by the antenna elements and adjusted by the beamforming circuits into a combined RF receive signal output using a further via within the interposer to a connection point on the wafer.

13. The antenna apparatus of claim 1, further comprising a plurality of solder bumps each electrically connecting a respective one of the first vias or the second vias to the wafer.

14. The antenna apparatus of claim 1, wherein the wafer is directly bonded to the multi-layer interposer.

15. The antenna apparatus of claim 1, wherein the radiating layer comprises an air-dielectric material grown on the interposer and supporting the antenna elements.

16. The antenna apparatus of claim 1, wherein the antenna elements are patch antenna elements each driven by a probe feed electrically coupled to one of the first vias.

17. An antenna apparatus comprising:
a radiating layer comprising a plurality of antenna elements forming an antenna array;
a semiconductor wafer comprising a plurality of radio frequency (RF) beamforming circuits each having transistor regions internally formed within the semiconductor wafer, each of the plurality of RF beamforming circuits comprising at least one phase shifter and at least one of a transmit path amplifier and a receive path amplifier; and
a multi-layer interposer comprising:
a lower dielectric layer adjacent to the semiconductor wafer;
an upper dielectric layer adjacent to the radiating layer;
a metal layer between the lower and upper layers and comprising a plurality of conductive traces that form a combiner/divider network that combines and/or divides signals between the plurality of RF beamforming circuits and an input/output connection point of the interposer;
a plurality of first vias extending through both the upper and lower layers and electrically coupling the plurality of RF beamforming circuits to the plurality of antenna elements; and
a plurality of second vias extending between the RF beamforming circuits and the conductive traces, some of the second vias interconnecting the antenna elements with the combiner/divider network through the RF beamforming circuits;
wherein the wafer includes at least one intermediate amplifier that amplifies a transmit signal or a receive signal routed through another one of the second vias from/to an intermediate point of the combiner/divider network and outputs the amplified transmit or receive signal back to the combiner/divider network through a further one of the second vias.

18. The antenna apparatus of claim 17, wherein:
the multi-layer interposer has a stripline construction comprising a first dielectric layer, a second dielectric layer, a lower ground plane between the wafer and the lower dielectric layer, and an upper ground plane between the upper dielectric layer and the radiating layer, the upper ground plane serving as a ground plane for the antenna elements.

19. The antenna apparatus of claim 17, wherein:
the combiner/divider network divides a transmit signal into a plurality of divided transmit signals at respective end points of the combiner/divider network;
each of the divided transmit signals is routed to the wafer at a respective one of the end points; and
the wafer further comprises a plurality of on-wafer combiner/dividers, each electrically connected respectively to one of the end points, that further divides the divided transmit signal into at least two further divided signals and routes each further divided signal to a respective one of the RF beamforming circuits.

20. The antenna apparatus of claim 17, wherein each of the transmit path amplifier and the receive path amplifier is a millimeter wave amplifier.

21. The antenna apparatus of claim 17, wherein the multi-layer interposer is comprised of quartz or fused silica.

22. A method of fabricating an antenna apparatus, comprising:
sequentially applying an identical reticle image to each of a plurality of regions of a semiconductor wafer to thereby form respective tiles within each region, each tile comprising radio frequency (RF) beamforming circuits having ion implanted transistor regions within the wafer and a metallization pattern on a surface of the wafer;
attaching an interposer to the wafer, the interposer comprising a lower dielectric layer adjacent to the wafer, an upper dielectric layer, a metal layer between the lower and upper dielectric layers and comprising a plurality of conductive traces, a plurality of first vias extending through both the upper and lower layers, and a plurality of second vias extending between a lower surface of the interposer and the metal layer to interconnect the plurality of tiles; and
attaching a radiating layer, comprising a plurality of antenna elements, to an upper surface of the interposer such that the antenna elements are electrically coupled to the RF beamforming circuits through the plurality of first vias.

23. The method of claim 22, wherein said attaching the radiating layer to an upper surface of the interposer comprises:
growing an air-dielectric material on the interposer;
forming probe feed vias within the grown air-dielectric material electrically connected at first ends thereof to respective ones of the first vias; and
forming the antenna elements on or within the air-dielectric material electrically connected to opposite ends of the probe feed vias.

24. The method of claim 22, wherein said attaching an interposer to the wafer comprises attaching a plurality of solder bumps to the lower surface of the interposer and/or to the wafer and soldering electrical contacts of each of the wafer and the interposer to opposite sides of the plurality of solder bumps.

25. The method of claim 22, wherein said attaching an interposer to the semiconductor wafer comprises directly attaching the lower surface of the interposer to a major surface of the wafer using a direct bonding interface bonding method.

* * * * *